United States Patent
Kawashiro

(10) Patent No.: US 12,381,132 B2
(45) Date of Patent: Aug. 5, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Fumiyoshi Kawashiro, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 860 days.

(21) Appl. No.: 17/466,186

(22) Filed: Sep. 3, 2021

(65) Prior Publication Data

US 2022/0301988 A1  Sep. 22, 2022

(30) Foreign Application Priority Data

Mar. 19, 2021  (JP) ................. 2021-046291

(51) Int. Cl.
*H01L 23/495*  (2006.01)
*H01L 21/48*  (2006.01)
*H01L 23/00*  (2006.01)

(52) U.S. Cl.
CPC .... *H01L 23/49524* (2013.01); *H01L 21/4825* (2013.01); *H01L 23/49562* (2013.01); *H01L 23/49582* (2013.01); *H01L 23/49586* (2013.01); *H01L 24/48* (2013.01); *H01L 2224/48245* (2013.01); *H01L 2924/182* (2013.01)

(58) Field of Classification Search
CPC ....... H01L 23/49562–49586; H01L 23/49524; H01L 21/4825; H01L 23/49582; H01L 24/48; H01L 2224/48245; H01L 2924/182; H01L 24/06; H01L 24/97; H01L 23/49537; H01L 2224/0603; H01L 21/4821–4842; H01L 23/49861; H01L 23/495–49596; B22F 3/10–1146
See application file for complete search history.

(56) References Cited

U.S. PATENT DOCUMENTS

| | | |
|---|---|---|
| 2012/0205790 A1 | 8/2012 | Haga |
| 2014/0084435 A1 | 3/2014 | Kimura |
| 2018/0138110 A1* | 5/2018 | Cook ................ H01L 23/49513 |
| 2018/0265349 A1 | 9/2018 | Ito |
| 2018/0269834 A1 | 9/2018 | Ito et al. |
| 2018/0269850 A1 | 9/2018 | Ito |
| 2019/0139866 A1 | 5/2019 | Kuraya et al. |
| 2022/0068733 A1* | 3/2022 | Kanai ..................... H01L 23/24 |

(Continued)

FOREIGN PATENT DOCUMENTS

| | | |
|---|---|---|
| CN | 106169443 A | 11/2016 |
| CN | 109755205 A | 5/2019 |

(Continued)

*Primary Examiner* — Shahed Ahmed
(74) *Attorney, Agent, or Firm* — Foley & Lardner LLP

(57) ABSTRACT

According to one embodiment, a semiconductor device includes: a semiconductor chip; a mold resin provided over the semiconductor chip, and having at least a recess along its bottom surface; and a first terminal provided along a first upper surface of the recess and electrically connected to the semiconductor chip.

13 Claims, 5 Drawing Sheets

(56) References Cited

U.S. PATENT DOCUMENTS

| | | | |
|---|---|---|---|
| 2022/0244111 A1* | 8/2022 | Masuda | H02M 7/53871 |
| 2024/0030080 A1* | 1/2024 | Koga | H01L 23/3107 |

FOREIGN PATENT DOCUMENTS

| | | |
|---|---|---|
| JP | S61-007654 A | 1/1986 |
| JP | H11-163007 A | 6/1999 |
| JP | 2000-332162 A | 11/2000 |
| JP | 2006-165411 A | 6/2006 |
| JP | 2011-216507 A | 10/2011 |
| JP | 5959386 B2 | 8/2016 |
| JP | 2016-219520 A | 12/2016 |
| JP | 2018-152755 A | 9/2018 |
| JP | 2018-152827 A | 9/2018 |
| JP | 2018-152828 A | 9/2018 |
| JP | 6621681 B2 | 12/2019 |

\* cited by examiner

SEMICONDUCTOR DEVICE

CROSS-REFERENCE TO RELATED APPLICATION(S)

This application is based upon and claims the benefit of priority from Japanese Patent Application No. 2021-046291, filed Mar. 19, 2021, the entire contents of which are incorporated herein by reference.

FIELD

Embodiments described herein relate generally to a semiconductor device.

BACKGROUND

Power semiconductor chips have been developed to control power, such as MOSFET (Metal-Oxide-Semiconductor Field-Effect Transistor) chips and IGBT (Insulated-Gate Bipolar Transistor) chips. Such chips can be used in various application fields, including power generation and transmission, rotating machines such as pumps and blowers, power supplies in communication systems and factories, railways with AC motors, electric vehicles, home appliances, etc.

A semiconductor device (sometimes formed as a power module) using such a power semiconductor chip has been developed. Such a semiconductor device is required to have higher performances, such as higher current density, lower loss, and higher heat dissipation.

DETAILED DESCRIPTION

Figure 1A:
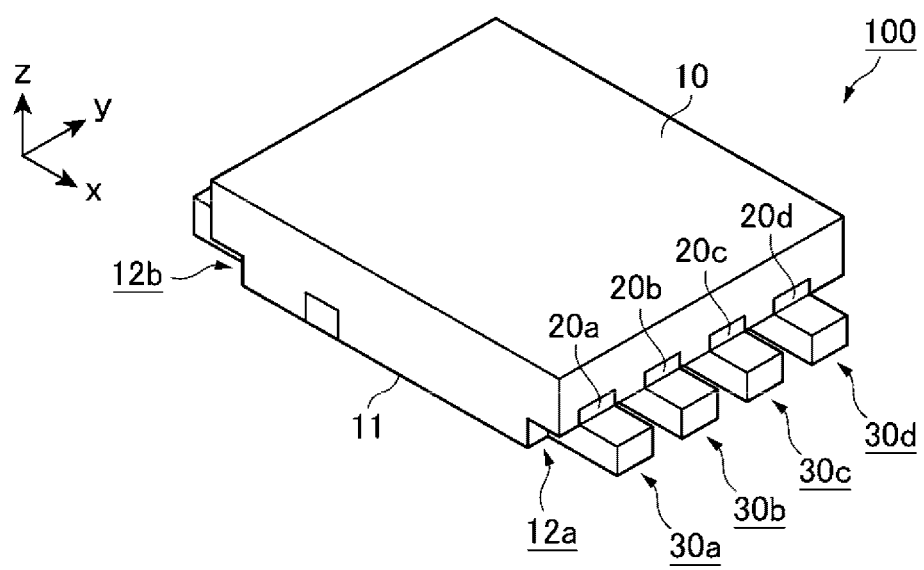
FIGS. 1A to 1C are schematic views of a semiconductor device according to an embodiment.

Embodiments provide a semiconductor device with enhanced supply capacity.

In general, according to one embodiment, a semiconductor device comprises: a semiconductor chip; a mold resin provided over the semiconductor chip, and having at least a recess along its bottom surface; and a first terminal provided along a first upper surface of the recess and electrically connected to the semiconductor chip.

Embodiments of the present disclosure will now be described with reference to the drawings. In the drawings and the description below, the same symbols are used for the same components or elements, and a duplicate description thereof may be omitted.

An upward direction and a downward direction in the drawings are herein described in such terms as "above" and "below" to indicate a positional relationship e.g. between components. The terms "above" and "below" do not always refer to the corresponding positional concept in the gravitational direction.

Embodiment

A semiconductor device according to an embodiment includes: a semiconductor chip; a mold resin provided around the semiconductor chip, having a rectangular shape, and having a recess in an end portion of the bottom surface; and a first terminal provided in a first upper surface of the recess and electrically connected to the semiconductor chip.

Figure 1B:
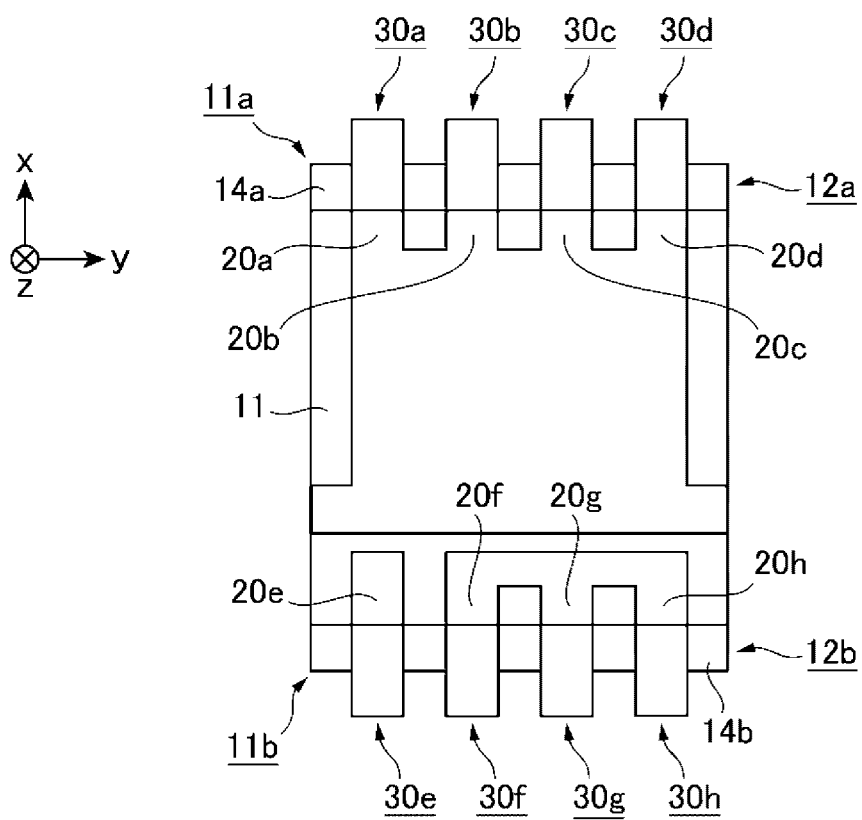
Figure 1C:
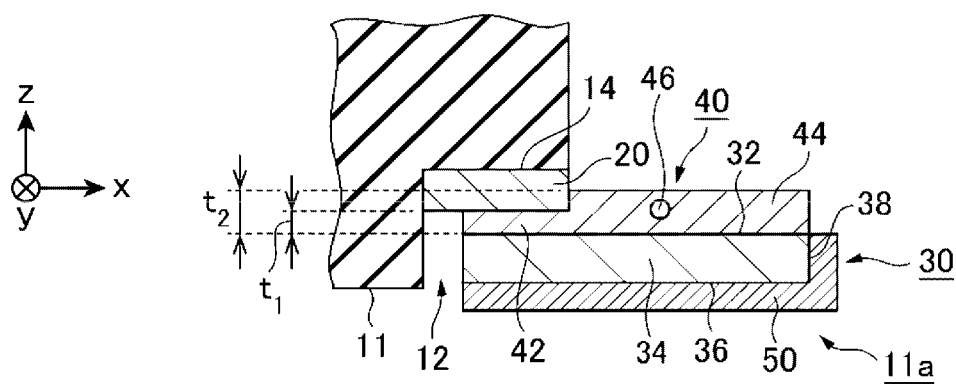
Figure 2:
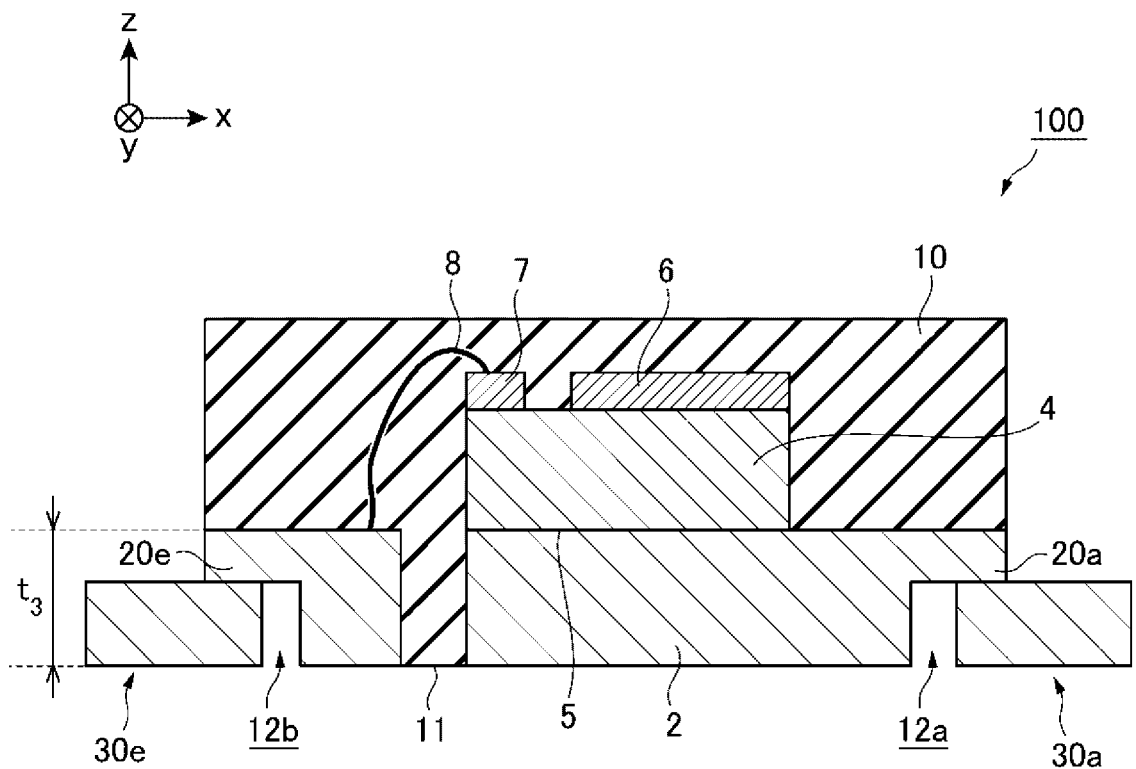
FIG. 2 is a schematic cross-sectional view of the semiconductor device according to the embodiment.

FIGS. 1A to 1C are schematic views of a semiconductor device 100 according to the embodiment. FIG. 1A is a schematic perspective view of the semiconductor device 100 according to the embodiment. FIG. 1B is a schematic bottom view of the semiconductor device 100 according to the embodiment. FIG. 1C is a schematic cross-sectional view of a main portion of the semiconductor device 100 according to the embodiment in a plane parallel to the XZ plane. FIG. 2 is a schematic cross-sectional view of the semiconductor device 100 according to the embodiment in a plane parallel to the XZ plane.

The semiconductor device 100 according to the embodiment will be described with reference to FIGS. 1 and 2.

A lead frame 2 (FIG. 2) is a plate-like member comprising a conductive material such as copper (Cu) and on which a semiconductor chip 4 is disposed.

The semiconductor chip 4 (FIG. 2) is provided, for example, on the lead frame 2. The semiconductor chip 4 is, for example, a vertical MOSFET or IGBT (Insulated-Gate Bipolar Transistor), but is not limited thereto. When the semiconductor chip 4 is a MOSFET, a drain electrode 5 provided in the bottom surface of the semiconductor chip 4 is electrically connected to the lead frame 2 via a not-shown bonding material provided between the semiconductor chip 4 and the lead frame 2. A conductive resin containing fine solder or silver particles, for example, is used as the bonding material. A source electrode 6 and a gate electrode 7, for example, are provided on the upper surface of the semiconductor chip 4.

A mold resin 10 is provided around the semiconductor chip 4. The mold resin 10 seals the semiconductor chip 4. The mold resin 10 is, for example, an epoxy resin. The mold resin 10 may contain a filler such as silicon oxide. The mold resin 10 has a rectangular shape. A recess 12 is provided in an end portion 11a of the bottom surface 11 of the mold resin 10.

X, Y and Z directions are herein defined as the directions shown in FIGS. 1A to 3B. The Y direction perpendicularly intersects the X direction. The Z direction perpendicularly intersects the X direction and the Y direction. The bottom surface 11 of the mold resin 10 is parallel to the XY plane.

As shown in FIGS. 1A and 1B, a recess 12a and a recess 12b are provided respectively in an end portion 11a and an end portion 11b, located opposite to each other, of the bottom surface 11 of the mold resin 10.

The recess 12a has a first upper surface 14a. A first terminal 20a, a first terminal 20b, a first terminal 20c, and a first terminal 20d are provided in the upper surface 14a (i.e., at least one of the first terminals 20a to 20d being exposed by the recess 12a).

The recess 12b has a first upper surface 14b. A first terminal 20e, a first terminal 20f, a first terminal 20g, and a first terminal 20h are provided in the upper surface 14b (i.e., at least one of the first terminals 20e to 20h being exposed by the recess 12b).

As shown in FIG. 2, the first terminal 20a is connected to the lead frame 2. As described above, the lead frame 2 is connected to the drain electrode 5 of the semiconductor chip 4. Thus, the first terminal 20a is electrically connected to the drain electrode 5 of the semiconductor chip 4. Though not shown diagrammatically, the first terminal 20b, the first terminal 20c and the first terminal 20d are also electrically connected to the drain electrode 5 of the semiconductor chip 4.

As shown in FIG. 2, the first terminal 20e is connected to the gate electrode 7 of the semiconductor chip 4 e.g. via a bonding wire 8. The first terminal 20e may be connected to the gate electrode 7 via a ribbon, a clip or a connector. Though not shown diagrammatically, the first terminal 20f, the first terminal 20g and the first terminal 20h are likewise electrically connected to the source electrode 6 of the semiconductor chip 4 e.g. via a bonding wire, a ribbon, a clip or a connector. The bonding wire 8, the ribbon, the clip or the connector comprises Cu (copper), Al (aluminum), Au (gold) or Ag (silver).

A second terminal 30 is a plate-like member. The second terminal 30 has a second upper surface 32. The thickness of the second terminal 30 is, for example, about 100 μm. For example, the sum $t_3$ (shown in FIG. 2) of the Z-direction thickness of the first terminal 20 and the Z-direction thickness of the second terminal 30 is preferably not less than 0.23 mm and not more than 0.33 mm based on JEDEC MP240.

The first terminal 20 and the second terminal 30 each comprise a metal material such as Au (gold), Ag (silver), Cu (copper), or Ni (nickel).

A sintered material 40 (FIG. 1C) is provided on the second upper surface 32. A first portion 42 of the sintered material 40 is connected to the first terminal 20. A second portion 44 of the sintered material 40, and the portion of the second terminal 30 on which the second portion 44 is provided project from the mold resin 10 and the recess 12.

The sintered material 40 is electrically conductive. The sintered material 40 is preferably one produced using particles of Ag (silver), Cu (copper), Ni (nickel), or the like. In particular, a dispersion of very fine particles (nanoparticles or microparticles) of Ag, Cu, or the like, whose surfaces are covered with a protective film, in an organic solvent is prepared, and the dispersion is subjected to a sintering process. The protective film and the organic solvent are evaporated during the sintering process to form the sintered material 40.

The sintered material 40 may also contain a resin. The use of a resin can provide heat resistance. While there is no particular limitation on the resin, an epoxy resin, for example, is preferably used.

In the case of the sintered material 40 containing no resin, sintering may be performed while applying pressure to a bonding portion e.g. by means of a pressing machine. In the case of the sintered material 40 containing a resin, sintering may be performed without the application of pressure. A sintering process is not limited to the above process.

Voids 46 may be provided in the first portion 42 and the second portion 44 of the sintered material 40. The voids 46 are formed, for example, by evaporation of the protective film, the organic solvent, or a resin in the above sintering process. The proportion of the voids 46 in the sintered material 40 is preferably not more than 20%. The proportion of the metal in the sintered material 40 is preferably not less than 80%. The number and the shape of the voids 46 are not limited to those illustrated in FIG. 1C.

The thickness of the sintered material 40 is preferably not less than 5 μm and not more than 200 μm.

The thickness $t_2$ of the second portion 44 is preferably larger than the thickness $t_1$ of the first portion 42.

The thickness of the first portion 42 is, for example, about 20 μm. The thickness of the second portion 44 is, for example, about 40 μm.

The length of that portion of the second terminal 30 which projects from the mold resin 10 is preferably as short as possible, for example not more than 100 μm, from the viewpoint of enhancing the electrical conductivity.

The second terminal 30 preferably includes a base material portion 34 comprising Cu (copper), and a film 50 provided on the bottom surface 36 (an example surface) of the base material portion 34 or on the side surface 38 (an example surface) of the base material portion 34. The film 50 (an example of a first film) preferably comprises a solderable metal such as Sn (tin), Au (gold), Cu (copper) or Ag (silver). Alternatively, the film 50 (an example of a second film) preferably is a N (nitrogen)-containing film such as a BTA (benzotriazole) film.

The materials used in the semiconductor device 100, the dimensions of the components of the semiconductor device 100, the proportion of the voids 46, etc. can be measured by SEM (scanning electron microscope), TEM (transmission electron microscope), Auger electron spectroscopy, XPS (X-ray photoelectron spectroscopy), EDX (energy dispersive X-ray spectroscopy), etc.

Figure 3A:
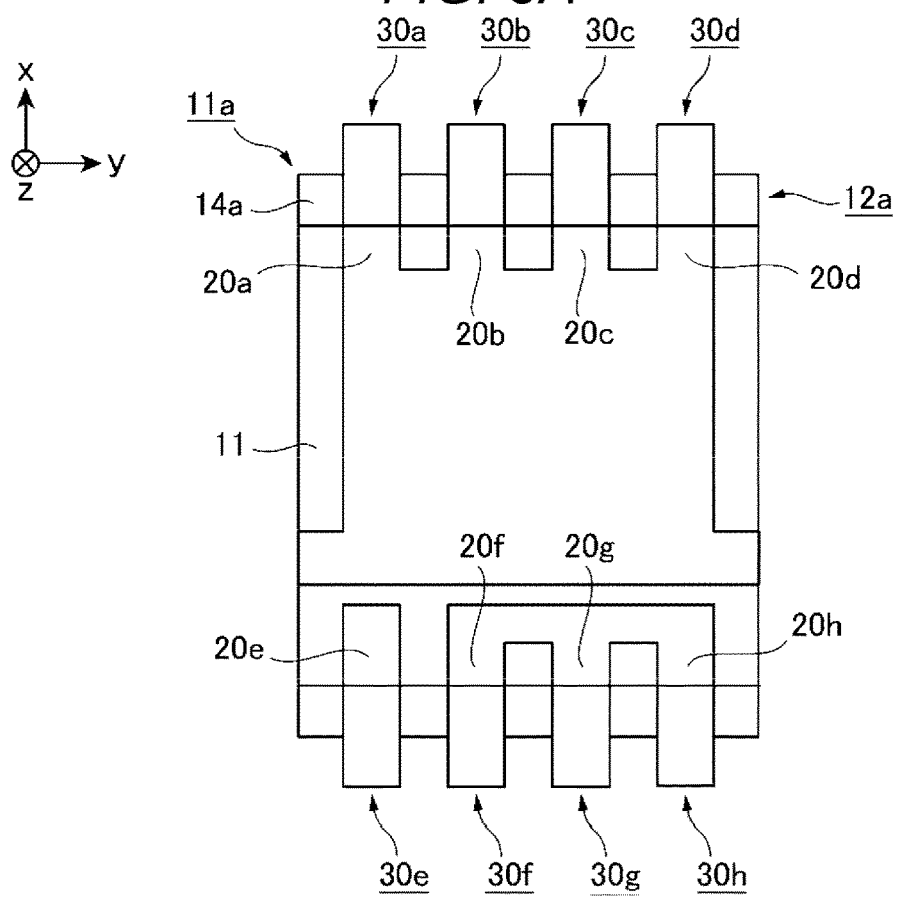
FIGS. 3A and 3B are schematic bottom views of the semiconductor device according to the embodiment.
Figure 3B:
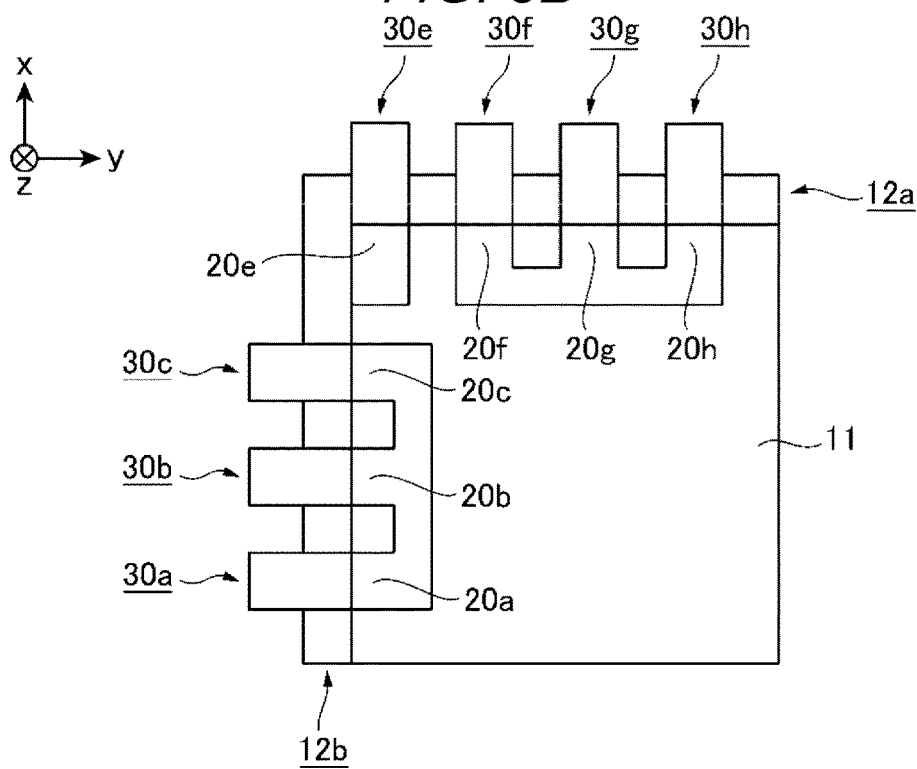

FIGS. 3A and 3B are schematic bottom views of the semiconductor device according to the embodiment. As shown in FIG. 3A, in the bottom surface 11, a second terminal 30a, a second terminal 30b, a second terminal 30c and a second terminal 30d, which are electrically connected to the drain electrode 5 of the semiconductor chip 4, are preferably provided opposite a second terminal 30f, a second terminal 30g and a second terminal 30h which are electrically connected to the source electrode 6 of the semiconductor chip 4. Alternatively, as shown in FIG. 3B, the second terminal 30a, the second terminal 30b and the second terminal 30c, which are electrically connected to the drain electrode 5 of the semiconductor chip 4, and the second terminal 30f, the second terminal 30g and the second terminal 30h, which are electrically connected to the source electrode 6 of the semiconductor chip 4, may be disposed on adjacent sides of the bottom surface 11.

Figure 4:
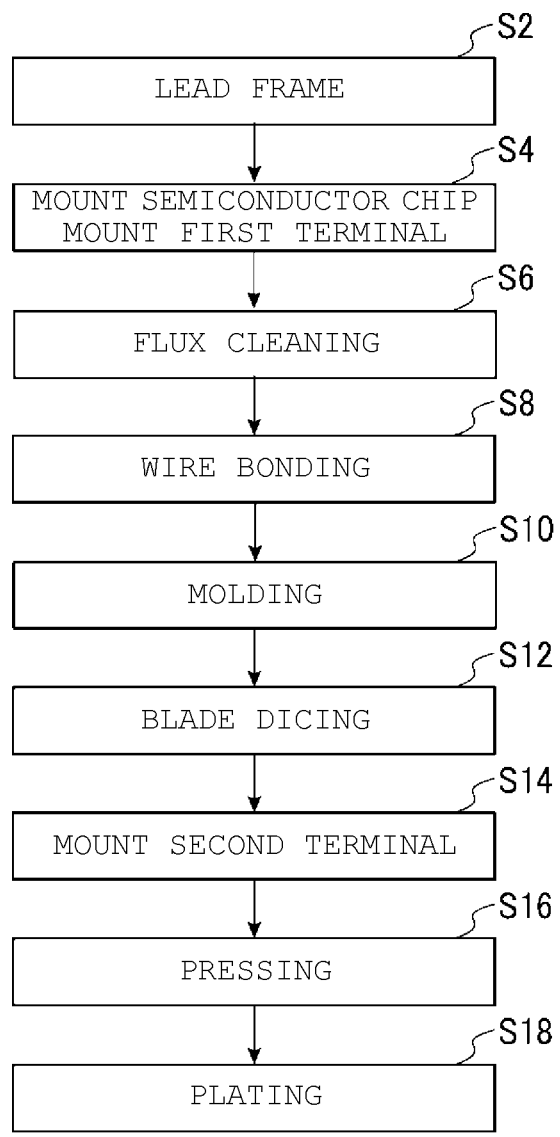
FIG. 4 is a flow chart of a process for manufacturing the semiconductor device according to the embodiment.

FIG. 4 is a flow chart of a process for manufacturing the semiconductor device according to the embodiment.

First, in a "lead frame" step, a lead frame 2 is prepared (S2).

Next, in a "semiconductor chip mounting" step and a "first terminal mounting" step, a semiconductor chip 4 is mounted on the lead frame 2 using a bonding material such as a solder (S4).

Next, in a "flux cleaning" step, a flux, possibly contained in the bonding material used in the mounting of the semiconductor chip 4, is cleaned (S6).

Next, in a "wire bonding" step, a first terminal 20 is connected to a source electrode 6 or a gate electrode 7 of the semiconductor chip 4 using, for example, a bonding wire 8 (S8). The connection may be performed by using a ribbon, a clip or a connector instead of the bonding wire 8.

Next, in a "molding" step, the lead frame 2, the semiconductor chip 4 and the first terminal 20 are sealed with a mold resin 10 (S10).

Next, in a "blade dicing" step, the bottom surface 11 of the mold resin 10 is diced with a blade in two steps in order to form a recess 12: First, using a first blade, the bottom surface 11 of the mold resin 10 is cut in the Z direction. The mold resin 10 is not completely cut with the first blade in the Z direction. Subsequently, using a second blade which is thinner than the first blade, the portion of the bottom surface 11 of the mold resin 10, which has been cut with the first blade, is cut in the Z direction, followed by cutting into individual pieces with an outer mold shape (S12). A recess 12 can be formed in this manner.

Next, in a "second terminal mounting" step, a second terminal 30, with a sintering material 40 placed on its second upper surface 32, is mounted in the recess 12 (S14).

Next, in a "pressing" step, the sintering material 40 on the second upper surface 32 is heated and pressed to form a sintered material 40, thereby bonding the second terminal 30 to the first terminal 20 (S16).

Next, in a "plating" step, a film 50 is formed on a bottom surface 36 and a side surface 38 of the second terminal 30 to obtain a semiconductor device 100 according to the embodiment (S18).

It is to be noted that a method for manufacturing the semiconductor device 100 according to the embodiment is not limited to the above-described method.

Advantageous effects of the semiconductor device according to the embodiment will now be described.

Figure 5A:
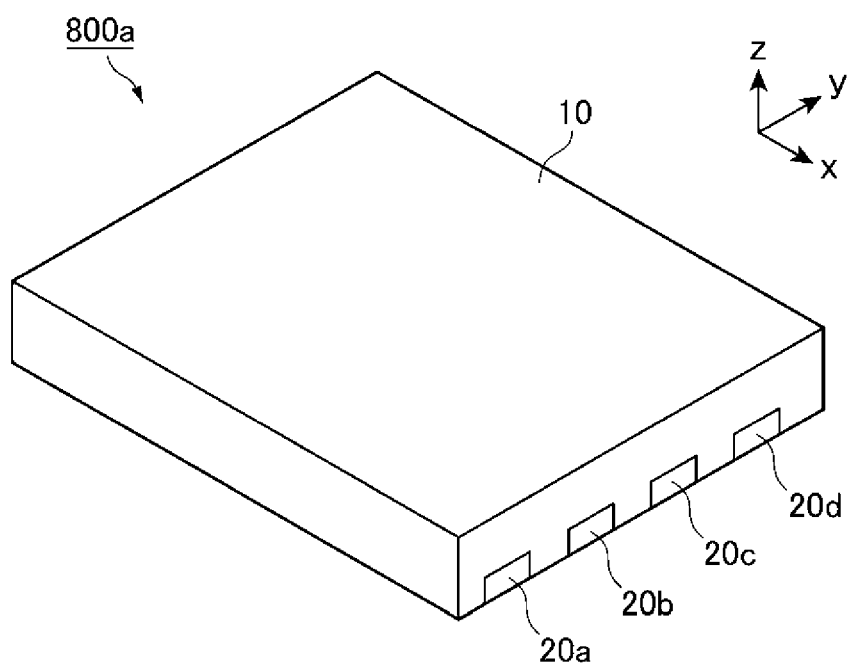
FIGS. 5A and 5B are schematic perspective views of comparative semiconductor devices.
Figure 5B:
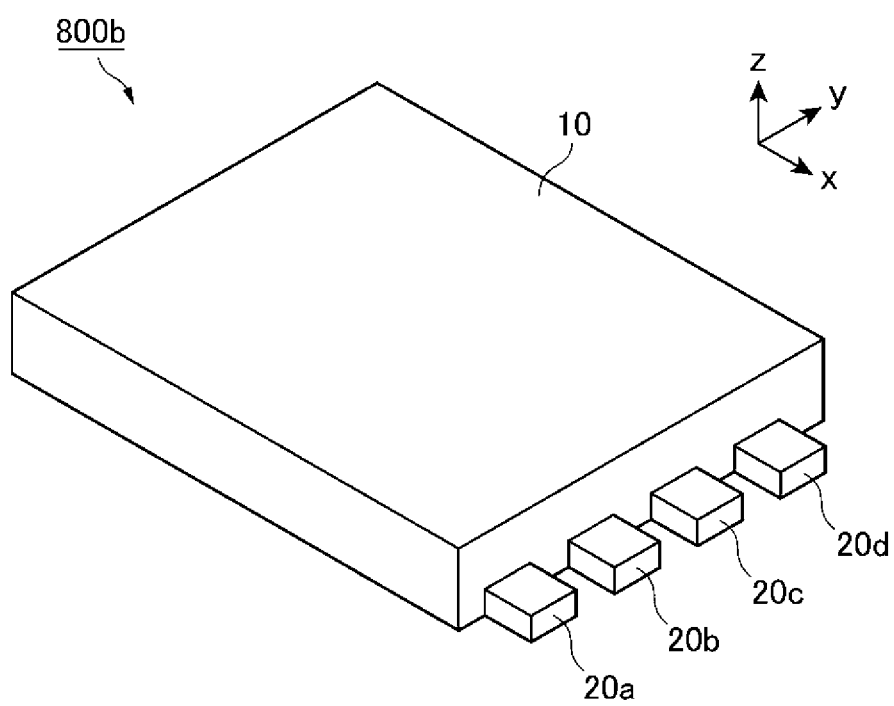

FIGS. 5A and 5B are schematic perspective views of comparative semiconductor devices 800a and 800b.

Semiconductor devices having a semiconductor chip 4 sealed with a mold resin 10 include those in which, like the semiconductor device 800a shown in FIG. 5A, first terminals 20 do not project from the mold resin 10, and those in which, like the semiconductor device 800b shown in FIG. 5B, first terminals 20 project from the mold resin 10. Semiconductor devices 800a, because of the first terminals 20 not projecting from the mold resin 10, can be mounted at a high density on a not-shown substrate such as a printed circuit board. On the other hand, the semiconductor device 800b, because of the first terminals 20 projecting from the mold resin 10, can be bonded to a not-shown substrate such as a printed circuit board with a larger mounting area (boding area) as compared to the semiconductor device 800a. The larger mounting area provides higher reliability.

Despite the use of the same semiconductor chip 4, preference is given to either the semiconductor device 800a or the semiconductor device 800b depending on the intended use, customer demand, etc. However, it is sometimes difficult to provide a required device because of different manufacturing processes for the semiconductor device 800a and the semiconductor device 800b.

The semiconductor device according to the embodiment includes: the semiconductor chip 4; the mold resin 10 provided around the semiconductor chip 4, having a rectangular shape, and having a recess in an end portion of the bottom surface; and the first terminals 20 provided in the first upper surface of the recess and electrically connected to the semiconductor chip 4.

The present semiconductor device, by selectively providing or not providing the second terminals 30, makes it possible to provide both the semiconductor device 800a and the semiconductor device 800b, shown in FIG. 5. Thus, it becomes possible to provide the semiconductor device with enhanced supply capacity.

The semiconductor device further includes the second terminals 30 each having the second upper surface 32, and the sintered materials 40 each provided on the second upper surface 32, and including the first portion 42 connected to the first terminal 20 and the second portion 44 projecting from the recess. This configuration makes it possible to provide the semiconductor device having the (second) terminals projecting from the mold resin 10. The provision of the second portion 44 enhances heat dissipation from the semiconductor chip 4 through the first terminal 20 and the second terminal 30.

The sintered material 40 comprising Ag (silver), Cu (copper) or Ni (nickel) exhibits good electrical conductivity. Further, the sintered material 40 does not melt e.g. at a temperature of about 260° C. upon its mounting to a substrate, such as a printed circuit board, e.g. with a solder. Therefore, the semiconductor device 100 can be mounted well to a substrate such as a printed circuit board.

When the second terminal 30 is bonded to the first terminal 20 by means of a pressing machine, the first portion 42 in contact with the first terminal 20 is crushed by the pressure from the first terminal 20. Accordingly, the thickness $t_2$ of the second portion 44, which is not in contact with the first terminal 20, is larger than the thickness $t_1$ of the first portion 42.

The voids 46 are formed in the sintered material 40 upon sintering. When the proportion of the voids 46 in the sintered material 40 is not more than 20%, the large proportion of metal provides good electrical conductivity.

When the second terminal 30 includes the base material portion 34 comprising Cu (copper), and the film 50 provided on a surface of the base material portion 34 and comprising a solderable metal, the semiconductor device 100 can be easily mounted to a substrate such as a printed circuit board.

When the second terminal 30 includes the base material portion 34 comprising Cu (copper), and the film 50 provided on a surface of the base material portion 34 and containing N (nitrogen), the second terminal 30 can have high oxidation resistance.

The thickness of the sintered material 40 is preferably not less than 5 μm and not more than 200 μm. This is because if the thickness is less than 5 μm, the bonding between the first terminal 20 and the second terminal 30 is poor. If the thickness is more than 200 μm, the volume of the voids 46 will increase, resulting in a decrease in the strength.

According to this embodiment, it becomes possible to provide the semiconductor device with enhanced supply capacity.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
    a lead frame comprising a first bottom surface and at least a recess at an end of the first bottom surface, the recess comprising a first side surface;
    a semiconductor chip provided on the lead frame;
    a first terminal comprising a second bottom surface extending from the first side surface of the recess, the first terminal electrically connected to the semiconductor chip;
    a second terminal having an upper surface; and
    a sintered material, provided on the upper surface of the second terminal, including a first portion connected to the first terminal, and a second portion protruding away from the recess.

2. The semiconductor device according to claim 1, wherein the second portion is thicker than the first portion.

3. The semiconductor device according to claim 1, wherein the sintered material comprises one of Ag (silver), Cu (copper) or Ni (nickel).

4. The semiconductor device according to claim 1, wherein the sintered material has at least one void.

5. The semiconductor device according to claim 4, wherein a proportion of the voids in the sintered material is not more than 20%.

6. The semiconductor device according to claim 1, wherein the second terminal includes
   a base material portion comprising Cu (copper), and
   a first film provided on a surface of the base material portion, the first film containing a solderable metal.

7. The semiconductor device according to claim 1, wherein the second terminal includes
   a base material portion comprising Cu (copper), and
   a second film provided on a surface of the base material portion, the second film containing N (nitrogen).

8. The semiconductor device according to claim 1, wherein the first terminal is electrically connected to a source electrode or a gate electrode formed along a top surface of the semiconductor chip.

9. The semiconductor device according to claim 8, wherein the first terminal is electrically connected to the source electrode or the gate electrode via a bonding wire.

10. The semiconductor device according to claim 1, wherein the first terminal is electrically connected to a drain electrode formed along a bottom surface of the semiconductor chip.

11. The semiconductor device according to claim 10, wherein the first terminal is electrically connected to the drain electrode via a lead frame.

12. The semiconductor device according to claim 1, wherein the semiconductor chip includes a Metal-Oxide-Semiconductor Field-Effect-Transistor (MOSFET) or an Insulated-Gate Bipolar Transistor (IGBT).

13. The semiconductor device according to claim 1, wherein a second terminal comprises a second side surface facing the first side of the recess, the second side surface apart from the first side surface.

* * * * *